United States Patent [19]

Graebel

[11] Patent Number: 4,661,927

[45] Date of Patent: Apr. 28, 1987

[54] INTEGRATED SCHOTTKY LOGIC READ ONLY MEMORY

[75] Inventor: Jeffrey P. Graebel, Maple Grove, Minn.

[73] Assignee: Honeywell Inc., Minneapolis, Minn.

[21] Appl. No.: 691,258

[22] Filed: Jan. 15, 1985

[51] Int. Cl.⁴ .............................................. G11C 11/36
[52] U.S. Cl. .................................. 365/175; 365/105; 365/203; 365/210
[58] Field of Search ................ 365/104, 105, 94, 203, 365/210, 175

[56] References Cited

U.S. PATENT DOCUMENTS

4,608,672  8/1986  Roberts .............................. 365/105

Primary Examiner—Terrell W. Fears
Attorney, Agent, or Firm—William T. Udseth

[57] ABSTRACT

An integrated Schottky logic (ISL) read only memory (ROM) uses ISL drivers and decoders connected to wordlines and data bitlines. The pattern of data stored in the ISL is determined by Schottky diodes which are connected between selected data bitlines and wordlines. Improved performance is achieved by using a leakage current compensation source (such as a wordline pullup resistor) connected to each wordline, and by using a programmable dummy load (such as one or more dummy bitlines). The pullup resistors compensate for bitline loading sensitivity caused by leakage currents of the workline drivers. The dummy bitlines are selectively connected to those wordlines which are lightly loaded to compensate for wordline loading sensitivity and thus equalize access time and improve wordline decoder noise margins.

23 Claims, 6 Drawing Figures

INTEGRATED SCHOTTKY LOGIC READ ONLY MEMORY

The United States Government has rights in this invention pursuant to Contract No. 33615-81-C-1527 awarded by the Air Force.

BACKGROUND OF THE INVENTION

1. Field of the Invention.

This invention relates to semiconductor memories. In particular, the present invention relates to an improved read only memory (ROM) which utilizes integrated Schottky logic (ISL) gates as wordline drivers and decoders.

2. Description of the Prior Art.

The development of semiconductor memory technology has included continual efforts to develop read only memory (ROM) devices with higher packing density, lower power dissipation, higher speed operation, and higher processing yields. The use of diode data fields to define the pattern of data within a ROM is particularly advantageous because diodes usually exhibit high processing yields and permit relatively high packing density. This is particularly true of Schottky diode arrays.

In a commonly assigned copending application Ser. No. 513,872, filed July 14, 1983, entitled "Semiconductor Memory" by P. Roberts and T. Vu (which is incorporated by reference herein), a read only memory is described which uses Schottky diode memory arrays together with integrated Schottky logic (ISL) or metal semiconductor field effect transistor (MESFET) gates as wordline drivers and decoders. This memory offers high packing density, very low power dissipation and very high speed.

ISL is a very large scale integration (VLSI) bipolar logic family which uses an NPN transistor, with a PNP clamp, to perform logic inversion. The AND function is accomplished by wiring together either merged (integrated) or discrete Schottky diodes. The result is a powerful VLSI technology that is compatible with standard bipolar processes.

In the ISL ROM proposed by Vu and Roberts, data is programmed by the presence or absence of a Schottky diode at each particular intersection of a wordline and a bitline. The presence of a Schottky diode results in a logic zero output. The absence of a diode results in a logic one output. The peripheral circuitry is ISL logic which performs as row and column decoders and as sense amplifiers for reading the data from the bitlines.

SUMMARY OF THE INVENTION

The present invention is based upon the recognition and discovery that an ISL ROM can exhibit pattern sensitivity that leads to performance degradation and in some cases loss of functionality. This pattern sensitivity (i.e. the change of performance of the ROM depending upon the particular pattern of data stored in the ROM) results from differences in wordline and bitline loading. This has the effect of reducing noise margins and causing variations in access time.

With the present invention, the ISL ROM further includes pattern sensitivity compensation means connected to the wordlines of the ISL ROM to compensate for variations in loading due to the particular data pattern being stored. In preferred embodiments, the pattern sensitivity compensation means make two significant changes to the ISL ROM to alleviate the pattern sensitivity problem. First, leakage current compensation means (preferably in the form of individual current sources such as workline pull-up resistors) are connected to each of the word lines to supply current to compensate for leakage currents of non-selected wordlines. These leakage currents are due to non-ideal operation of the wordline drivers, which are not completely "off" when a wordline is not selected for interrogation. The leakage current compensation means eliminate problems of variable bitline loading, which can otherwise result in improper operation of a sense amplifier connected to a heavily loaded bitline.

Second, programmable dummy load means (which acts like one or more additional dummy bitlines with very high current) is provided. The dummy bitlines are selectively connected to wordlines that are lightly loaded. This is done at the same time and in the same manner as programming the ROM by connecting diodes between wordlines and dummy bitlines as a function of loading on each wordline. This results in superior wordline decoder operation, as well as matched delays, independent of the data pattern.

DETAILED DESCRIPTION OF THE PREFERRED EMBODIMENTS

In one successful embodiment of the present invention, an improved ISL ROM of the present invention is in the form of a 1K×40 ROM arranged with 128 wordlines and 320 data bitlines. For the following description, this specific embodiment will be discussed in detail, but it should be recognized that the present invention is not limited to a particular number of wordlines or bitlines.

Figure 1:
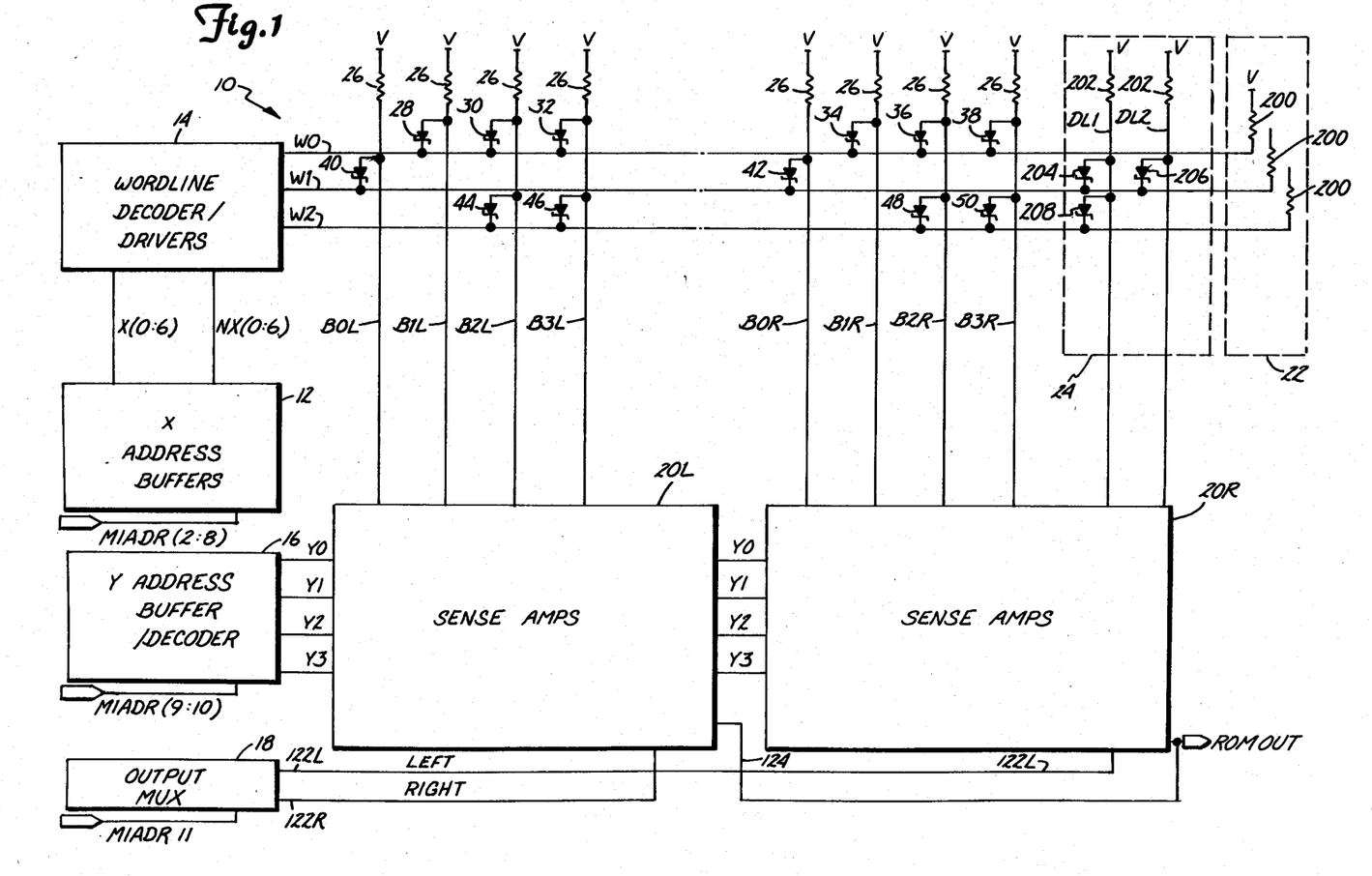
FIG. 1 is a circuit diagram, partially in block diagram form, showing the improved ISL ROM of the present invention.

ISL ROM 10 shown in FIG. 1 includes wordlines (of which W0, W1 and W2 are shown), data bitlines (of which B0L-B3L and B0R-B3R are shown), X address buffers 12, wordline decoder/drivers 14, Y address buffer/decoder 16, output multiplexer 18, sense amps 20L and 20R, leakage current compensation source 22, and dummy load 24.

Although in FIG. 1 wordline decoder/drivers 14 are shown diagrammatically at one end of wordlines W0-W2, wordline decoder/drivers 14 are preferably located in the center of ROM 10, with 160 data bitlines located on the left hand side, and the other 160 data bitlines located on the right hand side.

Each data bitline has a current source, preferably in the form of pull-up resistor 26, which connects the data bitline to a supply voltage V (e.g. 1.5 volts).

The intersection of each wordline and each data bitline represents one bit of the data pattern. The presence of a Schottky diode connected between the data bitline and the wordline at that intersection represents a logic "0". The absence of a Schottky diode connected at that intersection represents a logic "1".

In the particular example shown in FIG. 1, there is no Schottky diode at the intersection of B0L and W0, but bitlines B1L, B2L and B3L are each connected to wordline W0 by a Schottky diode 28, 30 and 32, respectively. Similarly, bitline B0R is not connected to wordline W0, but the remaining bitlines B1R, B2R and B3R are connected to wordline W0 by Schottky diodes 34, 36 and 38, respectively. The data pattern on wordline W0, therefore, is "1 0 0 0" for bitlines B0L–B3L and is "1 0 0 0" for bitlines B0R–B3R.

Wordline W1 is connected to bitline B0L by Schottky diode 40 and to bitline B0R by Schottky diode 42. The remaining bitlines which are shown in FIG. 1 are not connected to wordline W1.

Wordline W2 is connected to bitlines B2L and B3L by Schottky diodes 44 and 46, respectively. Similarly, wordline W2 is connected to bitlines B2R and B3R by Schottky diodes 48 and 50.

The 160 data bitlines on the left side are connected to sense amps 20L and the 160 data bitlines on the right side are connected to sense amps 20R. The forty outputs of sense amps 20L and 20R are tied together in pairs to provide a 40-bit output (ROMOUT) based upon signals from forty of the bitlines on either the left or right side. The particular bit lines and wordlines which are selected for readout are based upon a 10-bit input received on input lines MIADR2–MIADR11.

X address buffers 12 take lines MIADR2–MIARDR8, which operate at standard ISL signal levels, and buffers them to provide true and complement lines to wordline decoder/drivers 14. A total of fourteen lines (X0–X6 and NX0–NX6) are provided to wordline decoder/-drivers 14.

Figure 2:
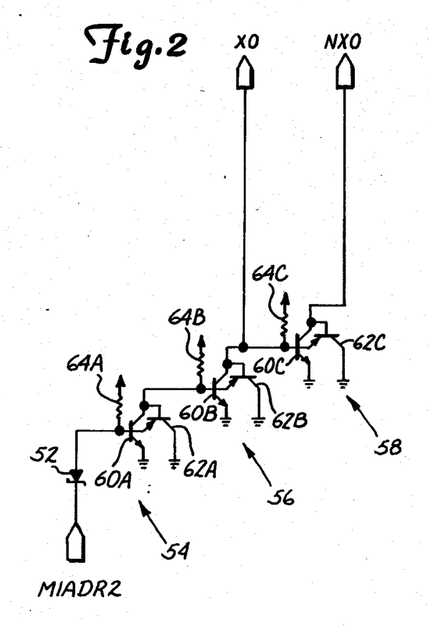
FIG. 2 is a schematic diagram of one of the X address buffers of the ISL ROM of FIG. 1.

FIG. 2 shows a portion of the X address buffer circuitry which converts the signal on address line MIADR2 to signals on the X0 and NX0 lines which are supplied to wordline decoder/drivers 14. Similar X address buffer circuitry is provided for each of the other address lines MIADR3–MIADR8.

As shown in FIG. 2, the X address buffer circuitry includes an input Schottky diode 52 and three ISL inverter gates 54, 56 and 58. Each ISL gate includes an NPN transistor 60A, 60B, 60C, a PNP clamp 62A, 62B, 62C and a pull-up resistor 64A, 64B, 64C, respectively. The base of NPN transistor 60A of inverter 54 is connected to the anode of Schottky diode 52. The collector of NPN transistor 60A is connected to the base of NPN transistor 60B of inverter 56. Similarly, the collector of NPN transistor 60B is connected to the base of NPN transistor 60C of inverter 58. Output line X0 is connected to the collector of NPN transistor 60B, and output line NX0 is connected to the collector of NPN transistor 60C.

A logic low or "0" at MIADR2 results in a logic low on line X0 and a logic high or "1" on line NX0. Conversely, a logic high at MIADR2 results in a logic high on line X0 and a logic low on line NX0.

Wordline decoder/drivers 14 select the active wordline based upon the signals on lines X0–X6 and NX0–NX6. Only one wordline is pulled low (which means that only one wordline driver is "ON" at a time).

Figure 3:
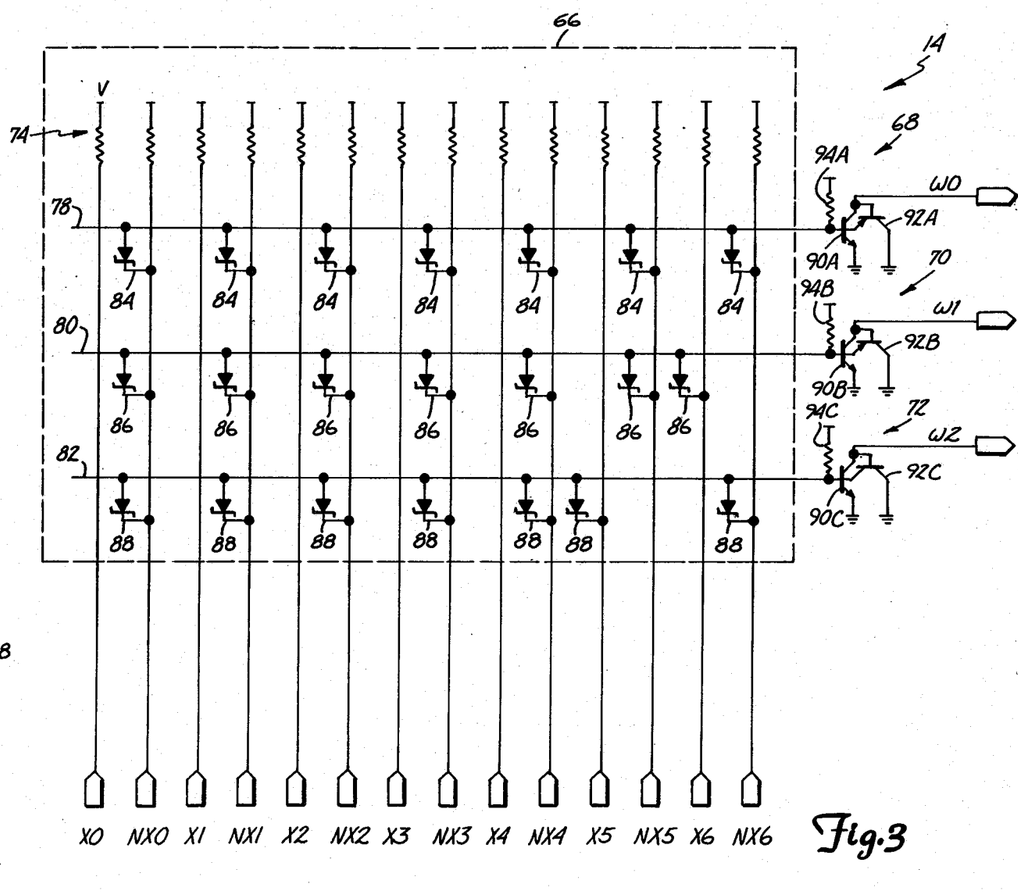
FIG. 3 is a schematic diagram showing one of the wordline decoder/drivers of the ISL ROM of FIG. 1.

FIG. 3 shows a portion of wordline decoder/driver circuit 14, which includes a decoder array 66 and wordline drivers 68, 70 and 72. Only three of a total of one hundred twenty-eight wordline drivers are shown, and only that portion of decoder array 66 related to wordline drivers 68, 70 and 72 is illustrated in FIG. 3.

As shown in FIG. 3, each of the input lines X0–X6 and NX0–NX6 are connected through pull-up resistors 74 to supply voltage V. Crossing each of the input lines X0–X6 and NX0–NX6 are driver input lines 78, 80 and 82 which are connected to wordline drivers 68, 70 and 72, respectively. A different combination of input lines X0–X6 and NX0–NX6 are connected to each of the one hundred twenty-eight driver input lines, of which input lines 78, 80 and 82 are examples. In the particular embodiment shown in FIG. 3, Schottky diodes 84 connect lines NX0–NX6 to input line 78. As a result, if any one of the input lines NX0–NX6 is low, the input to wordline driver 68 will be low and wordline driver 68 will be off.

Driver input line 80 is connected by diodes 86 to input lines NX0–NX5 and X6. If any of these lines is a logic low, the input to wordline driver 70 is low. Diodes 88 connect driver input line 82 to lines NX0–NX4, X5 and NX6. If any one of these lines is low, the input to wordline driver 72 is low.

Each of the wordline drivers, of which wordline drivers 68, 70 and 72 are shown as examples, is a ISL logic gate having an NPN transistor 90A, 90B, 90C, a PNP clamp 92A, 92B, 92C, and a pull-up resistor 94A, 94B, 94C, respectively.

When the driver input line (for example driver input line 78) is low, the base of the NPN transistor 90A is off. Conversely, when the driver input line 78 is high, NPN transistor 90A is on.

Through the decoder diodes in decoder array 66, only one wordline driver is on at any time, which selects the data on that particular wordline. When the wordline is selected, it is pulled low by the wordline driver, thus allowing current to be drawn from the current source (bitline pullup resistor 26) through the Schottky diodes connected to that wordline and through the NPN transistor of the wordline driver. For example, if wordline W0 is selected, NPN transistor 90A of wordline driver 68 is on. Current is permitted to flow through Schottky diodes 28, 30 and 32 and Schottky diodes 34, 36 and 38. As a result, when wordline W0 is selected, data bitlines B0L and B0R are the only data bitlines shown which can be high (because they are not connected to wordline W0) and data bitlines B1L–B3L and B1R–B3R are all low because the current is being routed through diodes 28, 30, 32, 34, 36 and 38 to wordline W0.

As will be discussed in further detail later, sense amps 20L and 20R select only one of each group of four data bitlines to read at a time, based on Y select signals on Y0–Y3. The three data bitlines which are not selected are pulled low, reglardless of whether Schottky diodes are present at the intersections of those three data bitlines and the selected wordline.

Figure 4:
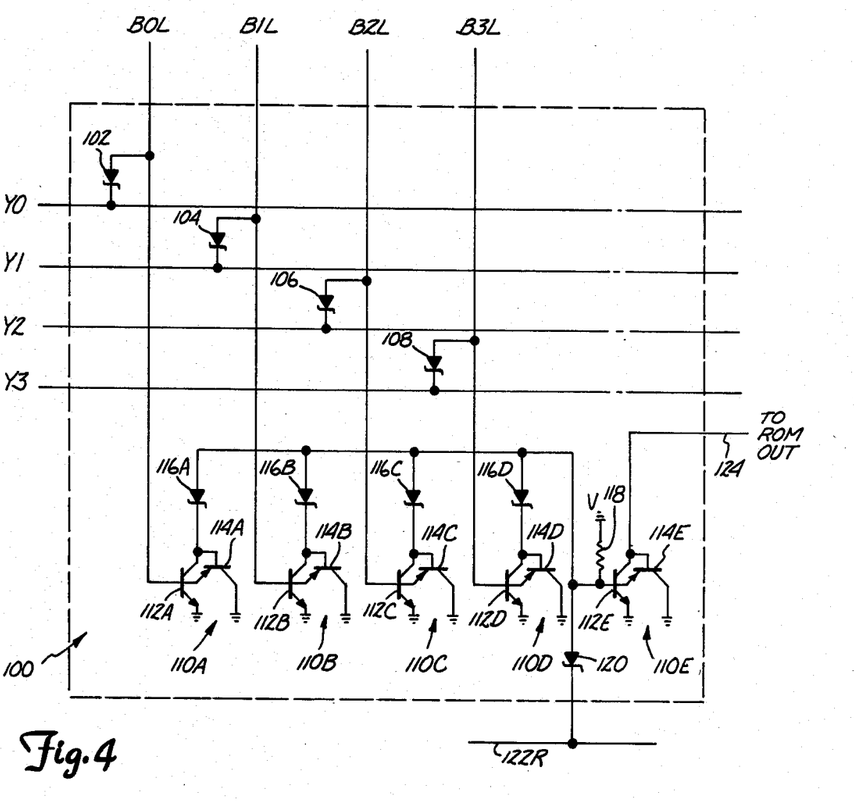
FIG. 4 is a schematic diagram of the Y adess buffer/decoder of the ISL ROM of FIG. 1.

In a preferred embodiment of the present invention, each group of four data bitlines are connected to a separate sense amp circuit, so that there are a total of forty sense amp circuits within each of the blocks shown in FIG. 1 as sense amps 20L and 20R. FIG. 4 shows sense amp 100, which is the sense amp connected to data bitlines B0L–B3L. Sense amp 100 receives bitlines B0L–B3L as well as Y decoder output lines Y0–Y3. Diode 102 connects bitline B0L to Y0. Diode 104 connects bitline B1L to Y1. Diode 106 connects bitline B2L to Y2, and diode 108 connects bitlines B3L to Y3.

Bitlines B0L–B3L are connected to sense amp gates 110A–110D, respectively. Each sense amp gate 110A–110D includes an NPN transistor 112A–112D, a PNP clamp 114A–114D, and a Schottky diode 116A–116D, respectively. The base of each transistor 112A–112D is connected to the respective bitline B0L–B3L, respectively. The collector of each NPN transistor 112A–112D is connected to the cathode of Schottky diode 116A–116D, respectively. The anodes of diodes 116A–116D are connected together to the input of sense amp gate 110E.

Gate 110E is an inverter gate which includes NPN transistor 112E, PNP clamp 114E, pull-up resistor 118 and Schottky diode 120. The base of NPN transistor 112E is the input of gate 110E, and is connected to the anodes of diodes 116A–116D. The base of transistor 112E is also connected through diode 120 to right select line 122R of output multiplexer 18. The output of gate 110E is the collector of transistor 112E and is connected to output line 124.

Sense amp circuit 100 provides an output on line 124 which is a function of the state of the bit stored at the intersection of the selected wordline with one of the four bitlines which is selected by Y address buffer/decoder 16. During a read operation, three of the four Y decoder lines are low, while the fourth Y decoder line is high. The bitline selected by the Y decoder line which is high, controls the output of sense amp 100. For example, if Y1 is high, while Y0, Y2 and Y3 are low, data bitlines B0L, B2L and B3L are all pulled low. This causes gates 110A, 110C and 110D to all be high since NPN transistors 112A, 112C and 112D are off. The output of sense amp 100 will, therefore, be determined by whether or not a diode is connected between bitline B1L and the selected wordline. If there is a data diode for that selected wordline and bitline B1L, the bitline B1L is pulled low, resulting in a high output from gate 110B and a low output from final gate 110E. The output supplied to output line 124, therefore, is a low or "0" output.

Conversely, if there is no diode at the intersection of the wordline with bitline B1L, NPN transistor 112D is turned on, which causes NPN transistor 112E to be turned off. This results in a high or "1" output from sense amp circuit 100.

Sense amp circuit 100 is selected when right select line 122R is high and left select line 122L is low. In that case, the base of NPN transistor 112E is controlled by the outputs from gates 112A–112D. At the same time, the corresponding sense amp circuit of sense amp 20R which is connected to bitlines B0R–B3R is disabled, since it is connected by a diode to left select line 122L.

When right select line 122R is low, diode 120 disables output gate 110E, since it pulls the base of NPN transistor 112E low. At the same time, the corresponding sense amp circuit connected to bitlines B0R–B3R is enabled.

Figure 5:
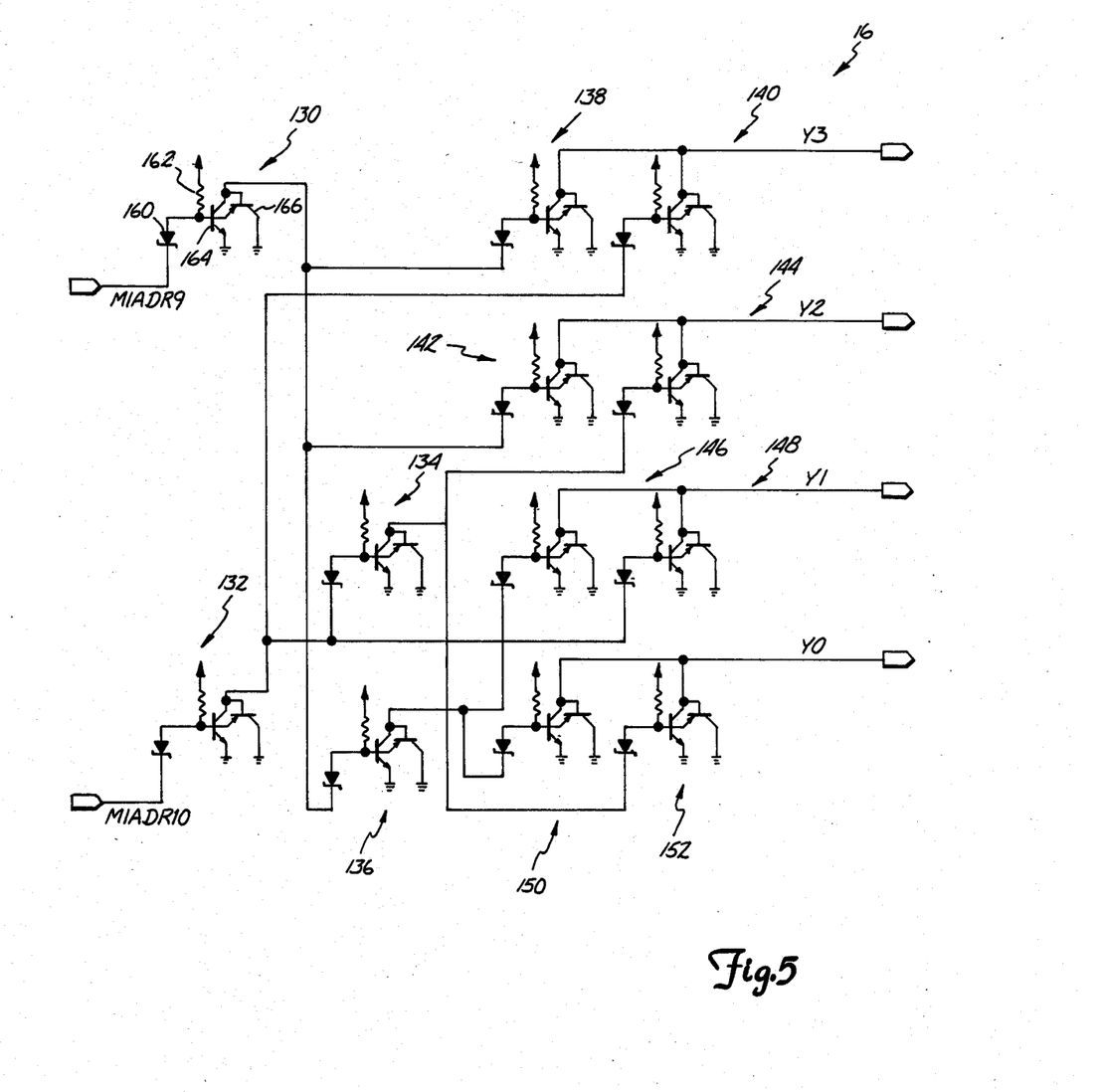
FIG. 5 is a schematic diagram of one of the sense amplifiers of the ISL ROM of FIG. 1.

FIG. 5 shows a preferred embodiment of Y address buffer/decoder 16. In this embodiment, two address lines MIADR9 and MIADR10 are decoded to provide the four Y decoder lines Y0–Y3. In this embodiment, Y address buffer/decoder 16 includes four input gates 130, 132, 134 and 136 and eight output gates 138, 140, 142, 144, 146, 148, 150 and 152. Each of the gates is similar in construction, and includes a Schottky diode 160, a pull-up resistor 162, an NPN transistor 164, and a PNP clamp 166. The input to each gate is the cathode of Schottky diode 160, and the output is the collector of NPN transistor 164.

Gates 130 and 132 have their inputs connected to address lines MIADR9 and MIADR10, respectively. The output of gate 130 is connected to the inputs of gates 136, 138 and 142. The output of gate 132 is connected to the inputs of gates 134, 140 and 148. The output of gate 134 is connected to the input of gates 144 and 152, while the output of gate 136 is connected to the inputs of gates 146 and 150.

Gates 138 and 140 have their outputs connected together to decoder output line Y3. Similarly, the outputs of gates 142 and 144 are connected to Y2; the outputs of gates 146 and 148 are connected to Y1; and the outputs of gates 150 and 152 are connected to Y0.

The four different combinations of states of address lines MIADR9 and MIADR10 result in four different combinations of outputs of lines Y0–Y3. In each case, however, only one of the four Y decoder lines is high, while the other three are low.

Figure 6:
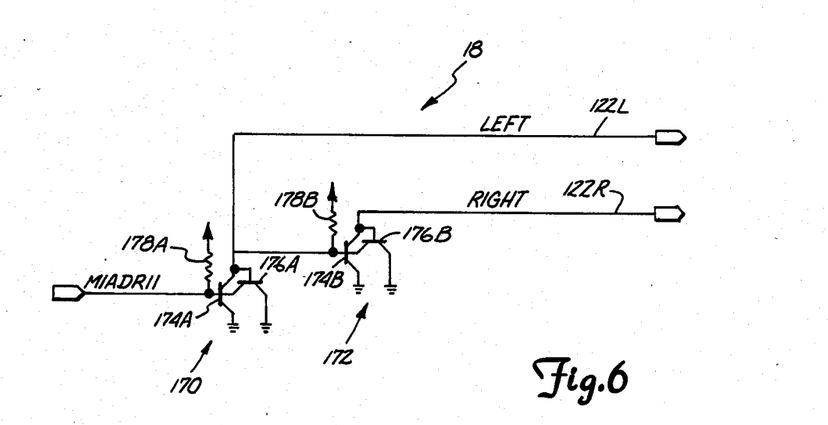
FIG. 6 is a schematic diagram of the output multiplexer of the ISL ROM of FIG. 1.

FIG. 6 shows output multiplexer 18, which provides signals on left and right select lines 122L and 122R based upon the state of the address bit supplied on address line MIADR11. Output multiplexer 18 is formed by a pair of ISL gates 170 and 172. Each gate includes NPN transistor 174A, 174B, a PNP clamp 176A, 176B and a pull-up resistor 178A, 178B. The output of gate 170 is connected to left select line 122L and to the base of transistor 174B, which is the input of gate 172. The output of gate 172, which is the collector of transistor 174B, is connected to right select line 122R.

When MIADR11 is high, transistor 174A is turned on and transistor 174B is turned off. This causes left select line 122L to be low and right select line 122R to be high. Conversely, when MIADR11 is low, transistor 174A is turned off and transistor 174B is turned on. This causes left select line 122L to be high, and right select line 122R to be low.

It has been discovered that an ISL ROM of the type which has been described thus far can exhibit substantial variations in performance depending upon the particular data pattern which is stored. This pattern sensitivity can lead to severe performance degradation or even loss of functionality of the ISL ROM. To overcome the problems with pattern sensitivity, leakage current compensation source 22 and dummy load 24 shown in FIG. 1 are added to the ISL ROM 10. Leakage current compensation source 22 and dummy load 24 alleviate two sources of pattern sensitivity problems in ISL ROM 10.

The first form of pattern sensitivity manifests itself as a variation in performance of sense amps 20L and 20R depending upon the loading of each data bitline. The greater the number of diodes connected to a particular data bitline, the lower the current levels available at the input of the sense amp 20L or 20R when the particular bit is a "1" (i.e. no diode at the intersection of the selected wordline with that data bitline). In extreme cases, the current level on the data bitline may be insufficient to turn on the NPN transistor (for example transistor 112A) of the sense amp even when the bit is supposed to be a "1".

The reason for the sensitivity to loading on the data bitline is due to leakage current of the wordline driver when the wordline driver transistor (e.g. NPN transistor 90A) is supposed to be off and the wordline is supposed to be high (nonselected). In fact, the NPN transistors of the wordline driver are not ideal, and a small amount of leakage current flows through the collector/emitter current path of each wordline driver transistor which is turned off. Each wordline driver which is supposed to be off exhibits the same leakage current. If a particular data bitline has a large number of diodes connected between that bitline and the nonselected wordlines, a significant amount of leakage current is drawn off of the bitline from those nonselected wordlines, which are supposed to be "high". This reduces the amount of current which is available at the input of the sense amp circuit connected to that bitline.

The leakage current of nonselected wordlines makes no difference if the bit being read out on that bitline is a "0" (i.e. the particular wordline selected is connected to the bitline by a diode) since in that case the current along the bitline is being drawn off through the connected diode to the selected wordline. In contrast, the leakage current is a significant problem when there is no diode connecting the bitline with the selected wordline (i.e. the bit being read out is a "1"). Although all of the bitline current is, in that case, supposed to be supplied to the sense amp 20L or 20R, the leakage currents of these nonselected wordlines which are connected to the bitline by diodes reduce the bitline current before it reaches the sense amp 20L or 20R. In extreme cases with heavy loading on a particular bitline, the leakage currents can result in incorrect operation of the sense amp 20L or 20R, so that a "1" stored at the intersection of the bitline with the selected wordline is incorrectly sensed as a "0".

With the present invention, this form of pattern sensitivity is eliminated by the use of leakage current compensation source 22. In a preferred embodiment shown in FIG. 1, leakage current compensation source 22 includes an individual current source, in the form of a pull-up resistor 200, connected to each wordline. The wordline pull-up resistors 200 are selected to have a value which supplies the needed leakage current along the wordline to the wordline driver, so that the wordline is truly "high" when it is not selected. With this improvement, the leakage currents of the wordline drivers do not affect performance of sense amps 20L and 20R, regardless of the loading of diodes on a particular data bitline.

The second form of pattern sensitivity results from variations in loading of the wordlines. The NPN transistor collector current of the wordline driver when turned on is proportional to the number of diodes connected to that wordline. This affects the wordline speed and the base-emitter voltage of the wordline driver. If the base-emitter voltage gets too small, it can cause improper operation of wordline decoder 12. This is because ISL logic is sensitive to mismatches of current densities from one stage to the next. There are no fixed output high and low voltages in ISL logic, but rather an output voltage swing, which depends upon current density.

Of even more significance is the speed penalty paid for a mismatch in wordline loading. A very lightly loaded wordline provides very little wordline driver collector current because the current is a function of the number of diodes connected to the wordline. Yet that lightly loaded wordline exhibits about the same capacitance as a heavily loaded wordline. The leading edge of the signal on the lightly loaded wordline as the driver is turned on, therefore, is slow due to the low amount of collector current available. The variation in delays is extremely great between the best case (a wordline having all "0"s—meaning that a diode is connected at the intersection of each bitline with that wordline) and the worst case delay (a wordline having all "1"s—meaning that no diodes are connected between that wordline and the bitlines).

With the present invention, this second form of pattern sensitivity is overcome by dummy load 24 in the form of a pair of dummy bitlines DL1 and DL2. Each dummy line DL1 and DL2 is provided with a current source in the form of pull-up resistor 202 connected to supply voltage V. Dummy lines DL1 and DL2 are selectively connected to wordlines by diodes, depending upon the loading on each particular wordline. FIG. 1 illustrates three different possible wordline loading levels. Wordline W0 has 75% loading—six of the eight data bitlines are connected to W0 by diodes. Wordline W2 has 50% loading—four of eight data bitlines connected to W2 by diodes. Wordline W1 has only 25% loading—two of eight bitlines are connected to W1 by diodes.

In order to equalize the variations in wordline loading, dummy lines DL1 and DL2 are not connected to heavily loaded wordline W0, but both are connected by diodes 204 and 206 to the very lightly loaded wordline W1. Wordline W2, which has an intermediate loading level, is connected by diode 208 to dummy line DL1. Dummy bitlines DL1 and DL2 are, therefore, selectively connected to the wordlines depending upon the loading on those wordlines. The lighter the loading on the wordline, the greater the need for connection to a dummy bitline. This tends to equalize the loading on the wordlines, thus resulting in superior wordline decoder operation, as well as matched delays, independent of the data pattern.

The programming of dummy lines DL1 and DL2 is done at the same time as the programming of the data with the ROM data array formed by the wordlines and the data bitlines. Thus no additional semiconductor processing steps are required.

If preferred embodiments of the present invention, pull-up resistors 202 connected to dummy bitlines DL1 and DL2 are of lower resistance than pull-up resistors 26 connected to the data bitlines, so that much higher current is supplied to the wordline by dummy lines DL1 and DL2 when they are connected to that wordline. Thus each dummy line, when connected to a wordline, is the equivalent of multiple loads. In a preferred embodiment of the present invention, each dummy bitline is the equivalent of 32.5 loads. This level is chosen because three-quarters of the data bitlines are losing their current to the Y address buffer/decoder 16 at any time. On those two hundred forty (240) bit lines which are not selected by Y address buffer/decoder 16, the bitline current is being shared between the wordline decoder driver for the selected wordline and the Y address buffer/decoder 16. The maximum load for a 320-bitline ISL ROM like that described in this example is eighty (80) full loads and two hundred forty (240) half loads. This represents a total maximum loading of two hundred (200) actual loads.

In this embodiment, a wordline having less than one hundred twenty-two (122) diodes connected to it has both dummy lines DL1 and DL2 connected by diodes (as for example wordline W1). For wordlines having between one hundred twenty-two (122) and one hundred eighty-eight (188) diodes connected, only one of the dummy lines is connected by a diode to that wordline (as for example, wordline W2). For heavily loaded wordlines with one hundred eighty-eight (188) up to three hundred twenty (320) diodes connected, neither of the dummy lines is connected (as for example, wordline W0).

The objective of dummy load 24 is, of course, to make the loading on the wordlines approximately equal, regardless of the data pattern. Although the specific embodiment which has been shown uses two dummy loads, other embodiments can use one dummy line, or more than two dummy lines. A trade-off is made between the precise equalization of wordline loading and the amount of chip area taken by the dummy bitline and dummy load diodes. With the particular embodiment described, it has been found that two dummy bitlines provide adequate programmability to approximately equalize wordline loading without consuming an undue amount of chip area. Dummy load 24 is also particularly efficient from a power consumption standpoint because it allows the same dummy load current to be shared among the wordlines.

In conclusion, the ISL ROM of the present invention offers high packing density, low power dissipation, high speed operation, and high processing yield. The present invention overcomes, pattern sensitivity problems, which can significantly degrade performance of an ISL ROM, or even result in a loss of functionality of the ISL ROM due to improper read out of stored data. The improvements provided by the leakage source compensation source and the dummy load are simple, can be produced at the same time that the ROM is being fabricated, do not require additional semiconductor processing, and do not unduly consume area of the integrated circuit chip.

Although the present invention has been described with reference to preferred embodiments, workers skilled in the art will recognize that changes may be made in form and detail without departing from the spirit and scope of the invention.

What is claimed is:

1. A read-only memory (ROM) device comprising:
   a plurality of wordlines;
   a plurality of data bitlines;
   diodes selectively connected between wordlines and data bitlines to represent a predetermined data pattern based upon presence and absence of a diode connected between each wordline and data bitline;
   wordline driver means for addressing a selected wordline;
   output means for deriving output signals representative of the data pattern based upon signals received from the data bitlines as the selected wordline is addressed; and
   pattern sensitivity compensation means connected to the wordlines for compensating for variations of loading due to the predetermined data pattern.

2. The ROM device of claim 1 wherein the pattern sensitivity compensation means comprises:
   leakage current compensation means for supplying current to the wordlines to compensate for leakage currents of the wordline driver means.

3. The ROM device of claim 2 wherein the leakage current compensation means comprises a wordline pullup connected to each wordline.

4. The ROM device of claim 1 wherein the pattern sensitivity compensation means comprises:
   dummy load means selectively connected to the wordlines for compensation for variations in wordline loading.

5. The ROM device of claim 4 wherein the dummy load means comprises:
   a dummy bitline; and
   diodes connected between the dummy bitline and selected wordlines, where presence of a diode between a particular wordline and the dummy bitline is a function of the number of diodes connected between that particular wordline and the data bitlines.

6. The ROM device of claim 4 wherein the dummy load means comprises:
   a plurality of dummy bitlines;
   a current source connected to each dummy bitline; and
   diodes selectively connecting the wordlines and the dummy bitlines as a function of the predetermined data pattern.

7. The ROM device of claim 1 wherein the pattern sensitivity compensation means compensates for heavy loading of diodes on the data bitlines.

8. The ROM device of claim 1 wherein the pattern sensitivity compensation means compensates for light loading of diodes on the wordlines.

9. The ROM device of claim 1 wherein the wordline driver means includes wordline driver connected to each of the wordlines.

10. The ROM device of claim 9 wherein the output means includes a sense amp connected to each of the data bitlines.

11. The ROM device of claim 10 wherein the selected wordline is addressed by the wordline driver connected to the selected wordline being turned on and the wordline drivers connected to all other wordlines being turned off.

12. The ROM device of claim 11 wherein the pattern sensitivity compensation means includes a current source connected to each wordline to provide a compensation current to each wordline which is not addressed which compensates for leakage currents of the wordline drivers while turned off.

13. The ROM device of claim 11 wherein the pattern sensitivity compensation means provides supplemental current to lightly loaded wordlines.

14. The ROM device of claim 1 wherein the pattern sensitivity compensation means comprises:
   leakage current compensation means for supplying current to the wordlines to compensate for leakage currents of the wordline driver means; and
   dummy load means selectively connected to the wordlines for compensation for variations in wordline loading.

15. The ROM device of claim 14 wherein the leakage current compensation means comprises a wordline pullup connected to each wordline.

16. The ROM device of claim 15 wherein the dummy load means comprises:
   a dummy bitline; and
   diodes connected between the dummy bitline and selected wordlines, where presence of a diode between a particular wordline and the dummy bitline is a function of the number of diodes connected between that particular wordline and the data bitlines.

17. The ROM device of claim 15 wherein the dummy load means comprises:
   a plurality of dummy bitlines;
   a current source connected to each dummy bitline; and diodes selectively connecting the wordlines and the dummy bitlines as a function of the predetermined data pattern.

18. An integrated Schottky logic (ISL) read only memory (ROM) device comprising:
   a plurality of wordlines;
   a plurality of data bitlines;
   a current source connected to each data bitline;
   a wordline driver connected to each wordline;
   a sense amp connected to each data bitline;
   an array of Schottky diodes connected between wordlines and data bitlines to represent a predtermined data pattern based upon presence and absence of a Schottky diode connected between each wordline and data bitline; and
   pattern sensitivity compensation means connected to the wordlines for compensating for variation of loading due to the predetermined data pattern.

19. The ISL ROM of claim 18 wherein the pattern sensitivity compensation means comprises:
   a current source connected to each of the wordlines to compensate for variations in bitline loading.

20. The ISL ROM of claim 18 wherein the pattern sensitivity compensation means comprises:
   a dummy load selectively connected to the wordlines for compensation for variations in wordline loading.

21. The ISL ROM of claim 20 wherein the dummy load comprises a plurality of dummy bitlines; a current source connected to each dummy bitline; and diodes selectively connecting the wordlines and the dummy bitlines as a function of the predetermined data pattern.

22. The ISL ROM of claim 18 wherein the pattern sensitivity compensation means comprises:
   a current source connected to each of the wordlines to compensate for variations in bitline loading; and
   a dummy load selectively connected to the wordlines for compensation for variations in wordline loading.

23. The ISL ROM of claim 22 wherein the dummy load comprises a purality of dummy bitlines; a current source connected to each dummy bitline; and diodes selectively connecting the wordlines and the dummy bitlines as a function of the predetermined data pattern.

* * * * *